(12) United States Patent
Makino

(10) Patent No.: US 11,735,700 B2
(45) Date of Patent: Aug. 22, 2023

(54) DISPLAY DEVICE

(71) Applicant: JUTAKU KANKYO SETSUBI CO., LTD, Tokyo (JP)

(72) Inventor: Katsuhiko Makino, Tokyo (JP)

(73) Assignee: JUTAKU KANKYO SETSUBI CO., LTD, Tokyo (JP)

( * ) Notice: Subject to any disclaimer, the term of this patent is extended or adjusted under 35 U.S.C. 154(b) by 540 days.

(21) Appl. No.: 16/978,377

(22) PCT Filed: Apr. 26, 2019

(86) PCT No.: PCT/JP2019/017930
§ 371 (c)(1),
(2) Date: Sep. 4, 2020

(87) PCT Pub. No.: WO2019/216268
PCT Pub. Date: Nov. 14, 2019

(65) Prior Publication Data
US 2020/0411740 A1    Dec. 31, 2020

(30) Foreign Application Priority Data

May 9, 2018   (JP) ................. 2018-090596

(51) Int. Cl.
*H01L 33/62* (2010.01)
*G09G 3/32* (2016.01)
*H01L 25/075* (2006.01)

(52) U.S. Cl.
CPC ........... *H01L 33/62* (2013.01); *G09G 3/32* (2013.01); *H01L 25/0753* (2013.01)

(58) Field of Classification Search
CPC combination set(s) only.
See application file for complete search history.

(56) References Cited

U.S. PATENT DOCUMENTS

| 2010/0085526 A1* | 4/2010 | Chen ............... G02F 1/1345 349/152 |
| 2012/0104936 A1 | 5/2012 | Lin et al. |
| 2014/0203310 A1* | 7/2014 | Fujii .................. G09F 9/33 257/89 |

FOREIGN PATENT DOCUMENTS

| JP | 2000-149835 A | 5/2000 |
| JP | 3121729 U | 5/2006 |

(Continued)

OTHER PUBLICATIONS

Translation of International Search Report dated Jul. 30, 2019 and Written Opinion in corresponding International application No. PCT/JP2019/017930; 8 pages.

*Primary Examiner* — Ratisha Mehta
(74) *Attorney, Agent, or Firm* — Maier & Maier, PLLC

(57) ABSTRACT

A display device includes: a transparent circuit board and a plurality of light-emitting elements arrayed in matrix on the transparent circuit board, the light-emitting elements each including a pair of terminals which drive voltage for light emission is applied, the circuit board including a plurality of row wires each connecting ones of the pairs of terminals of ones of the light-emitting elements to each other, the ones of the light-emitting elements belonging to a same one of rows in the matrix array, and a plurality of column wires each connecting other ones of the pairs of terminals of ones of the light-emitting elements to each other, the ones of the light-emitting elements belonging to a same one of columns in the matrix array, the plurality of row wires and the plurality of column wires being formed on different surfaces of the circuit board.

6 Claims, 13 Drawing Sheets

(56) References Cited

FOREIGN PATENT DOCUMENTS

| | | |
|---|---|---|
| JP | 2008-3112 A | 1/2008 |
| JP | 2015-166756 A | 9/2015 |
| JP | 6115903 B1 | 4/2017 |

* cited by examiner

DISPLAY DEVICE

FIELD

The present disclosure relates to a display device that causes a plurality of light-emitting elements arrayed in matrix to display images.

BACKGROUND

Dot-matrix display devices in which a plurality of light-emitting elements are arrayed in matrix to display letters, symbols, images, and the like are capable of forming a large display region despite a relatively simple configuration, and hence are used for various purposes such as signboards and information boards. In particular, LEDs are capable of exhibiting high luminance despite their small sizes, and hence are suited to pixels of the dot-matrix display devices.

Patent Literature 1 cited below discloses an in-vehicle LED display device that can be installed, for example, to a rear window glass of a vehicle. In this in-vehicle LED display device, a plurality of LED elements are arrayed between transparent boards. When its display region is viewed from a front, a rear side of the display region can be visually recognized therethrough.

SUMMARY

In the above-described in-vehicle LED display device disclosed in Patent Literature 1, highly-conductive chip components (jumpers) are used at intersection parts of wires that connect the plurality of LED elements arrayed in matrix to each other. Specifically, at an intersection part of two of the wires, one of the two wires is routed through the chip component (jumper), and another one of the two wires is routed on the transparent board under the chip component. In such a configuration, not only the LED elements but also the chip components are arrayed on the transparent board. Thus, transparency of the display region is degraded, with the result that visibility in viewing through the display region is liable to be degraded. It is preferred that, when the display device to be used is attached, for example, to the window of the vehicle, the display region be as transparent as possible.

In view of such circumstances, the present disclosure has been made to provide a display device in which transparency of a display region where a plurality of light-emitting elements are arrayed is easily increased.

According to an aspect of the present disclosure, there is provided a display device including:

a transparent circuit board; and a plurality of light-emitting elements arrayed in matrix on the transparent circuit board, the plurality of light-emitting elements each including a pair of terminals to which drive voltage for light emission is applied, the transparent circuit board including a plurality of row wires each connecting ones of the pairs of terminals of ones of the plurality of light-emitting elements to each other, the ones of the plurality of light-emitting elements belonging to a same one of rows in the matrix array, and a plurality of column wires each connecting other ones of the pairs of terminals of ones of the plurality of light-emitting elements to each other, the ones of the plurality of light-emitting elements belonging to a same one of columns in the matrix array, the plurality of row wires and the plurality of column wires being formed on different surfaces of the transparent circuit board at intersection portions of the plurality of row wires and the plurality of column wires, the plurality of column wires being formed on a front surface of the transparent circuit board at the intersection portions of the plurality of row wires and the plurality of column wires, the plurality of row wires being formed on a rear surface of the transparent circuit board at the intersection portions of the plurality of row wires and the plurality of column wires, the plurality of row wires including one or more pairs of row wires, the one or more pairs of row wires including parts that are located on an outside of a region where the plurality of light-emitting elements are arrayed in a plan view of the transparent circuit board, and that are formed on the different surfaces of the transparent circuit board such that at least the parts overlap with each other in the plan view of the transparent circuit board, the one or more pairs of row wires including one row wire that is traversed from the rear surface to the front surface through one of the vias, the one of the vias being connected to one of the pair of terminals of one of the plurality of light-emitting elements, the one of the plurality of light-emitting elements belonging to an outermost one of the columns in the matrix array.

In this display device, at the intersection portions of the plurality of row wires and the plurality of column wires, the plurality of row wires and the plurality of column wires are formed on the different surfaces of the transparent circuit board. Thus, in comparison with a case where the chip components and the like are used for causing the plurality of row wires and the plurality of column wires to intersect with each other, the number of components to be mounted to the transparent circuit board decreases. As a result, the transparency of the display region where the plurality of light-emitting elements are arrayed is easily increased.

It is preferred that the one or more pairs of row wires include two of the plurality of row wires, the two of the plurality of row wires corresponding to adjacent two of the rows in the matrix array.

With this configuration, the one or more pairs of two of the plurality of row wires correspond to adjacent two of the rows, and are located at positions close to each other. Thus, lengths of these plurality of row wires are easily reduced, and at the same time, these plurality of row wires are easily formed at positions overlapping with each other in the plan view of the transparent circuit board.

It is preferred that the plurality of light-emitting elements be arrayed on the front surface of the transparent circuit board, and that the plurality of row wires each include the plurality of vias provided on a route that connects the ones of the pairs of terminals of the ones of the plurality of light-emitting elements and a corresponding one of the plurality of row wires formed on the rear surface to each other, the ones of the plurality of light-emitting elements belonging to the same one of the rows in the matrix array.

According to the present invention, there is provided a display device including:

a transparent circuit board; and a plurality of light-emitting elements arrayed in matrix on the transparent circuit board, the plurality of light-emitting elements each including a pair of terminals to which drive voltage for light emission is applied, the transparent circuit board including
a plurality of row wires each connecting ones of the pairs of terminals of ones of the plurality of light-emitting elements to each other, the ones of the plurality of light-emitting elements belonging to a same one of rows in the matrix array, and
a plurality of column wires each connecting other ones of the pairs of terminals of ones of the plurality of light-emitting elements to each other, the ones of the plurality of light-emitting elements belonging to a same one of columns in the matrix array,
the plurality of row wires and the plurality of column wires being formed on different surfaces of the transparent circuit board at intersection portions of the plurality of row wires and the plurality of column wires,
the plurality of column wires being formed on a front surface of the transparent circuit board at the intersection portions of the plurality of row wires and the plurality of column wires,
the plurality of row wires being formed on a rear surface of the transparent circuit board at the intersection portions of the plurality of row wires and the plurality of column wires,
the plurality of row wires including at least one row wire including a branch wire extending along the columns in the matrix array,
the branch wire of the at least one row wire including
one or more column-direction extending portions
that are formed on the rear surface, and
that extend such that at least one of the one or more column-direction extending portions overlaps with a corresponding one of the plurality of column wires in a plan view of the transparent circuit board, and
one or more rear-side bypassing portions
that are formed on the rear surface, and
that bypass ones of the intersection portions of the corresponding one of the plurality of column wires and other ones of the plurality of row wires,
the at least one column wire including one or more front-side bypassing portions
that are formed on the front surface, and
that intersect with the one or more rear-side bypassing portions.

With this configuration, a circuit to be connected to the branch wire extending along the columns, and a circuit to be connected to the plurality of column wires are easily arranged close to each other. With this, a region where the circuits are arranged can be made compact. In addition, in the plan view of the transparent circuit board, the at least one of the one or more column-direction extending portions of the branch wire extends to overlap with the corresponding one of the plurality of column wires. Thus, an area of a non-transparent part of the display region decreases.

It is preferred
that the transparent circuit board include a plurality of pairs of conductive pads corresponding to the plurality of light-emitting elements,
that the plurality of pairs of conductive pads be each conducted to a corresponding one of the pairs of terminals of corresponding ones of the plurality of light-emitting elements,
that the plurality of pairs of conductive pads include at least one conductive pad that is used also as the one or more front-side bypassing portions, and
that the one or more rear-side bypassing portions each include a part that is formed at a position overlapping with a region where a corresponding one of the plurality of light-emitting elements is attached in the plan view of the transparent circuit board, the corresponding one of the plurality of light-emitting elements including corresponding ones of the plurality of pairs of conductive pads.

With this configuration, the plurality of pairs of conductive pads each include the at least one conductive pad that is used also as the one or more front-side bypassing portions. Thus, in comparison with a case where the one or more front-side bypassing portions and the at least one conductive pad are used independently of each other, the area of the non-transparent part of the display region decreases. In addition, in the plan view of the transparent circuit board, the part of each of the one or more rear-side bypassing portions is formed at the position overlapping with the region where the corresponding one of the plurality of light-emitting elements is attached. Thus, in comparison with a case where the one or more rear-side bypassing portions are each arranged at a position out of the region where the corresponding one of the plurality of light-emitting elements is attached, the area of the non-transparent part of the display region decreases.

It is preferred
that the plurality of column wires each include a plurality of pad connection portions
that are formed on the front surface, and
that are connected to a plurality of corresponding ones of the plurality of pairs of conductive pads, and
that the one or more rear-side bypassing portions each include another part that is formed at a position overlapping with a corresponding one of the plurality of pad connection portions in the plan view of the transparent circuit board.

With this configuration, in the plan view of the transparent circuit board, the other part of each of the one or more rear-side bypassing portions is formed at the position overlapping with the corresponding one of the plurality of pad connection portions. Thus, the area of the non-transparent part of the display region decreases.

According to the present invention, the display device in which the transparency of the display region where the plurality of light-emitting elements are arrayed is easily increased can be provided.

DETAILED DESCRIPTION

First Embodiment

Figure 1:
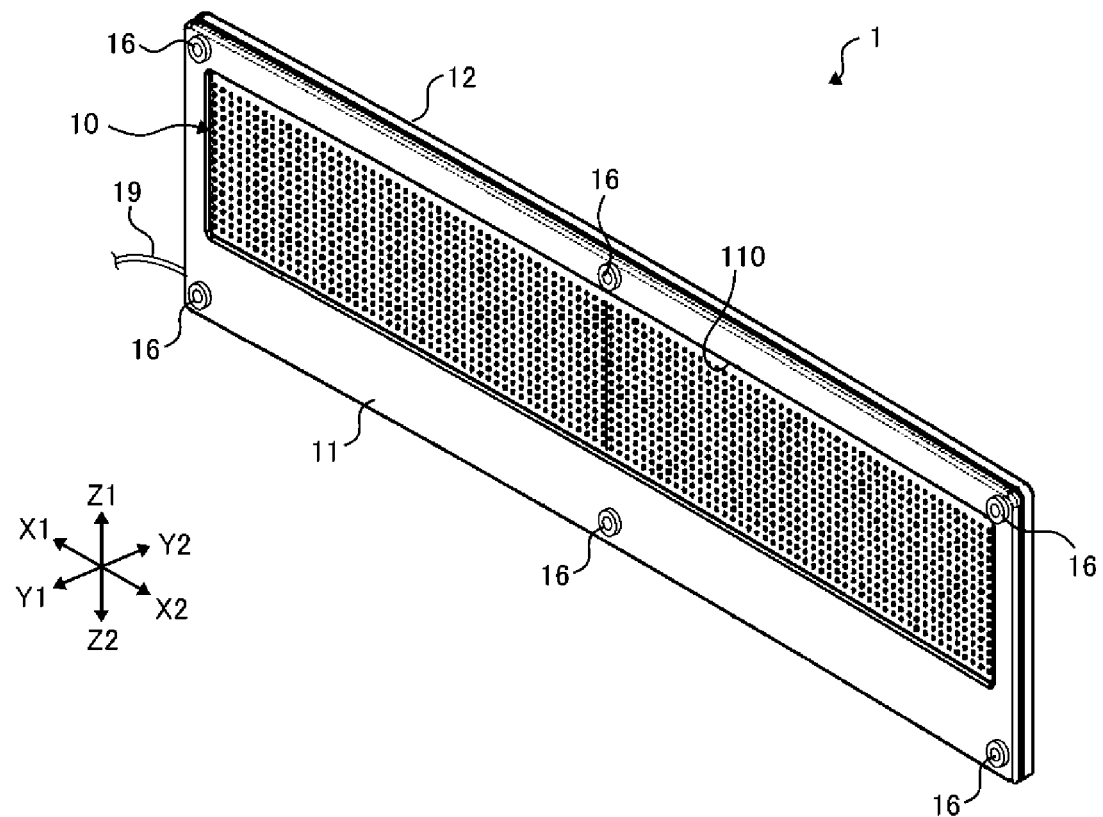
FIG. 1 is a perspective view illustrating an example of an external appearance of a display device according to an embodiment of the present invention.
Figure 2:
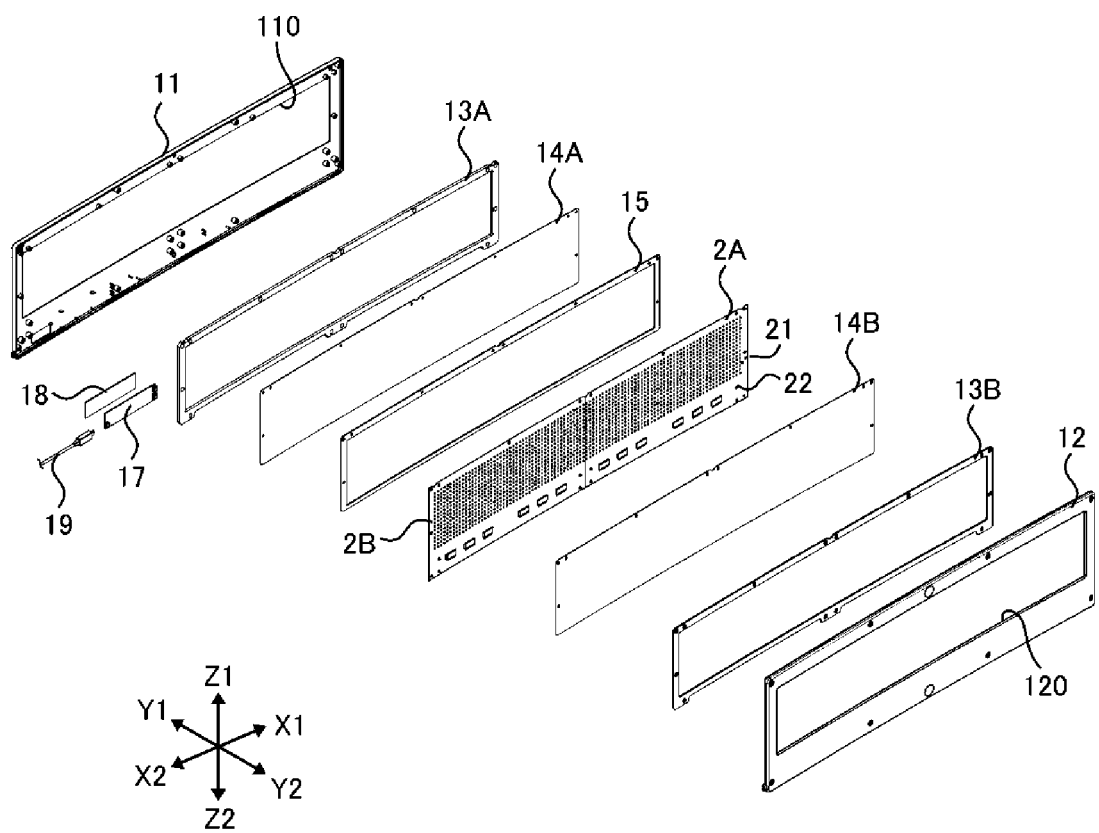
FIG. 2 is an exploded perspective view of the display device illustrated in FIG. 1.

FIG. 1 is a perspective view illustrating an example of an external appearance of a display device 1 according to this embodiment. FIG. 2 is an exploded perspective view of the display device 1 illustrated in FIG. 1. In the following description with reference to the drawings, three directions orthogonal to each other (X, Y, and Z) are defined. The X-direction includes an "X1" direction and an "X2" direction opposite to each other. The Y-direction includes a "Y1" direction and a "Y2" direction opposite to each other. The Z-direction includes a "Z1" direction and a "Z2" direction opposite to each other. With respect to the display device 1 as a center, the X1-direction is also referred to as a left-hand direction, the X2-direction as a right-hand direction, the Y1-direction as a front direction, the Y2-direction as a rear direction, the Z1-direction as an upper direction, and the Z2-direction as a lower direction. In addition, the X-direction is also referred to as a width direction or a lateral direction, the Y-direction as a depth direction or a front-and-rear direction, and the Z-direction as a height direction and a vertical direction. The display device 1 in the perspective view of FIG. 1 is viewed obliquely downward from the front upper right, and the display device 1 in the exploded perspective view of FIG. 2 is viewed obliquely downward from the rear upper right. These directions are defined merely for the sake of convenience of description, and hence are not intended to limit how the display device 1 is used.

In the example illustrated in FIG. 1 and FIG. 2, the display device 1 includes transparent circuit boards 2A and 2B, a front panel 11, a rear case 12, gaskets 13A and 13B, transparent plates 14A and 14B, a spacer 15, a circuit board 17, a cushion 18, and a cable 19.

The display device 1 illustrated in FIG. 1 has a plate shape with a small depth as a whole. The shape of the display device 1 as viewed from the front is a rectangle elongated in the lateral direction. On a surface on the front side of the display device 1, a display region 10 that displays letters, symbols, graphics, and the like is provided. The display region 10 also has the rectangular shape elongated in the lateral direction as viewed from the front. The display region 10 is substantially transparent except parts described below where light-emitting elements L and wires are provided. When the display region 10 is viewed from the front, a rear side of the display region 10 can be visually recognized therethrough.

On the surface on the front side (front surface) of the display device 1, a plurality of magnets 16 are provided. In the example illustrated in FIG. 1, six magnets 16 are arranged near edges of the front surface of the display device 1. These magnets 16 are arranged for fixing the display device 1 to a target (such as a window of a vehicle). Specifically, magnetic bodies (such as iron and magnets) fixed to the target of attachment and the magnets 16 provided on the front surface of the display device 1 are attracted to each other, whereby the display device 1 is attached to the target.

The front panel 11 and the rear case 12 constitutes a plate-like casing that houses therein the circuit boards 2A and 2B and other components. As illustrated in FIG. 2, the front panel 11 constitutes a part on the front side of the casing, and the rear case constitutes a part on the rear side of the casing. The above-mentioned plurality of magnets 16 are provided on an outer surface (front surface) of the front panel 11. The front panel 11 has a rectangular opening portion 110 that defines the display region 10, and the rear case 12 has an opening portion 120 conforming to the opening portion 110 of the front panel 11. The casing constituted by combining the front panel 11 and the rear case 12 with each other has a rectangular hole formed therethrough of these opening portions (110 and 120) in the front-and-rear direction.

The circuit boards 2A and 2B are each made of a transparent material such as plastic, and each have a laterally-long rectangular shape. Short sides of the circuit boards 2A and 2B illustrated in FIG. 2 are held in abutment against each other, thereby constituting a single laterally-long board as a whole. The circuit boards 2A and 2B are each, for example, a transparent flexible printed circuit (FPC). The plurality of light-emitting elements L forming the display region 10, and electronic components for turning on these light-emitting elements L are mounted to a front surface 21 (surface on the front side) of the circuit boards 2A and 2B.

As illustrated in FIG. 2, the front surface 21 of the circuit boards 2A and 2B is covered with the rectangular transparent plate 14A, and a rear surface 22 of the circuit boards 2A and 2B is covered with the rectangular transparent plate 14B. The spacer 15 is inserted between the front surface 21 of the circuit boards 2A and 2B and the transparent plate 14A. The spacer 15, which is a frame-like member elongated along edges of the rectangular board constituted by the circuit boards 2A and 2B, forms a clearance for allowing the light-emitting elements L and the electronic components to be arrayed between the front surface 21 of the circuit boards 2A and 2B and the transparent plate 14A.

As illustrated in FIG. 2, edge portions of the transparent plate 14A are held in abutment from inside against edge portions of the opening portion 110 of the front panel 11 through intermediation of the gasket 13A. Edge portions of the transparent plate 14B are held in abutment from inside against edge portions of the opening portion 120 of the rear case 12 through intermediation of the gasket 13B. The circuit board 17 is attached to an inner surface of the front panel 11 through intermediation of the cushion 18. Components that constitute a control circuit 203 and an interface circuit 204 described below are mainly mounted to the circuit board 17. The cable 19, which is provided for communication interfaces such as a USB, is connected to the circuit board 17. The members of the display device 1, which are illustrated in FIG. 2, are assembled by being fixed to each other with screws and the like (not shown).

Figure 3:
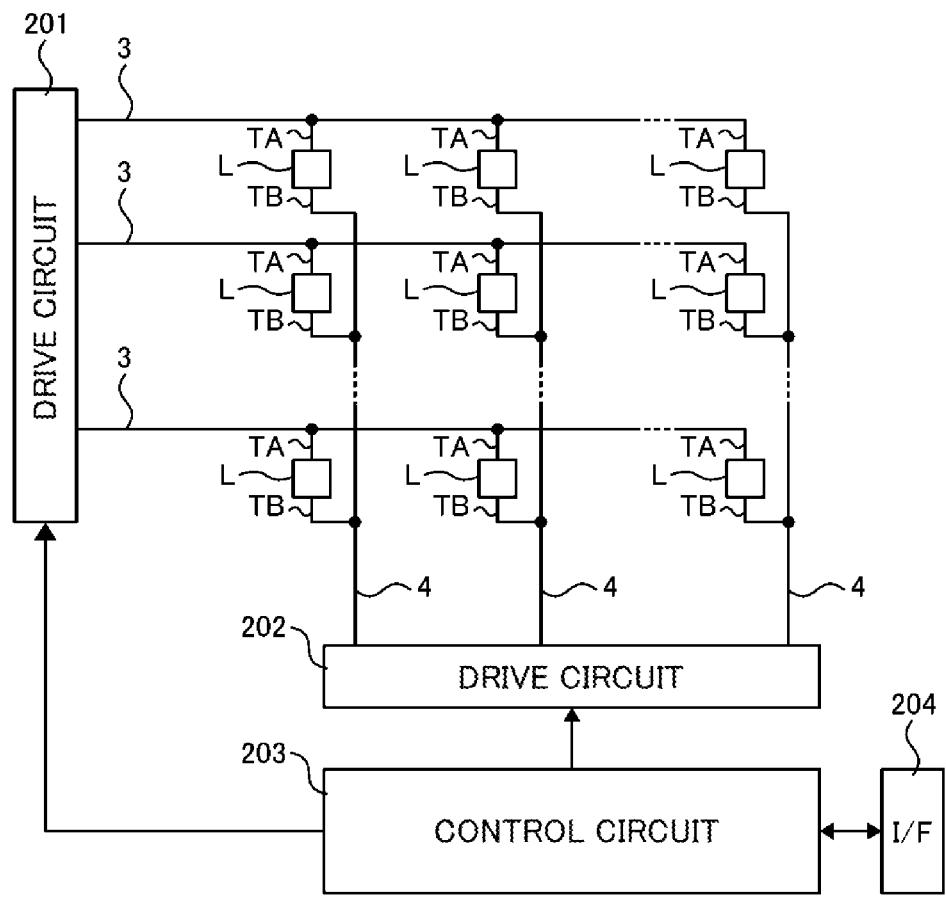
FIG. 3 is a diagram showing an example of a configuration of the display device according to the embodiment.

FIG. 3 is a diagram showing an example of a configuration of the display device 1 according to this embodiment. The display device 1 includes the plurality of light-emitting elements L arrayed in matrix on the circuit boards 2A and 2B, drive circuits 201 and 202 for driving these plurality of light-emitting elements L, the control circuit 203 that controls the drive circuits 201 and 202, and the interface circuit 204.

The plurality of light-emitting elements L each include a pair of terminals TA and TB to which drive voltage for light emission is applied. The light-emitting elements L are, for example, light-emitting diodes, and one of the terminals TA and TB is an anode terminal, and another one is a cathode terminal.

The circuit boards 2A and 2B (below, circuit boards 2A and 2B may sometimes be collectively referred to as a "circuit board 2") include a plurality of row wires 3 and a plurality of column wires 4. The plurality of row wires 3 correspond to a plurality of rows in the matrix array of the light-emitting elements L, and the plurality of column wires 4 correspond to a plurality of columns in the matrix array of the light-emitting elements L. One of the row wires 3 connects the terminals TA of ones of the plurality of light-emitting elements L to each other, the ones belonging to a corresponding one of the rows. One of the column wires 4 connects the terminals TB of ones of the plurality of light-emitting elements L to each other, the ones belonging to a corresponding one of the columns. The light-emitting elements L emit light when predetermined drive voltage is applied to the terminals TA and TB through the row wires 3 and the column wires 4.

The drive circuit 201 drives the plurality of row wires 3, and the drive circuit 202 drives the plurality of column wires 4, respectively. Specifically, the drive circuit 201 applies a potential at one of two points having a difference corresponding to the drive voltage therebetween to one of the row wires 3, which is selected under control by the control circuit 203, and the drive circuit 202 applies a potential at another one of the two points having the difference corresponding to the drive voltage therebetween to any of the column wires 4, which is selected under control by the control circuit 203. In this way, ones of the light-emitting elements L in one of the rows can be selected from the plurality of light-emitting elements L, and light emission of the selected ones of the light-emitting elements L in the one of the rows can be independently controlled. On the circuit board 2, both the drive circuits 201 and 202 are arranged below the region where the plurality of light-emitting elements L are arrayed in matrix.

The control circuit 203 controls the drive circuits 201 and 202 so as to cause the plurality of light-emitting elements L arrayed in matrix to display the predetermined letters, symbols, graphics, and the like in response to control commands to be input via the interface circuit 204. Specifically, the control circuit 203 periodically selects the light-emitting elements L on a row-by-row basis, and controls the drive circuits 201 and 202 so as to cause the light-emitting elements L in selected ones of the rows to emit light independently and appropriately in accordance with the contents to be displayed.

The control circuit 203 includes, for example, a computer that executes processes in accordance with instruction codes of programs stored in a storage device, and causes the computer to execute at least ones of the processes, which relate to the control of the drive circuits 201 and 202 and which are executed in accordance with the control commands. Note that, the ones of the processes in the control circuit 203 may be executed by dedicated hardware (logic circuit).

The interface circuit 204 is a circuit that exchanges data items, commands, and the like with external devices (such as a host computer) (not shown). The interface circuit 204 communicates with the external devices according, for example, to predetermined communication standards such as the USB.

Figure 4:
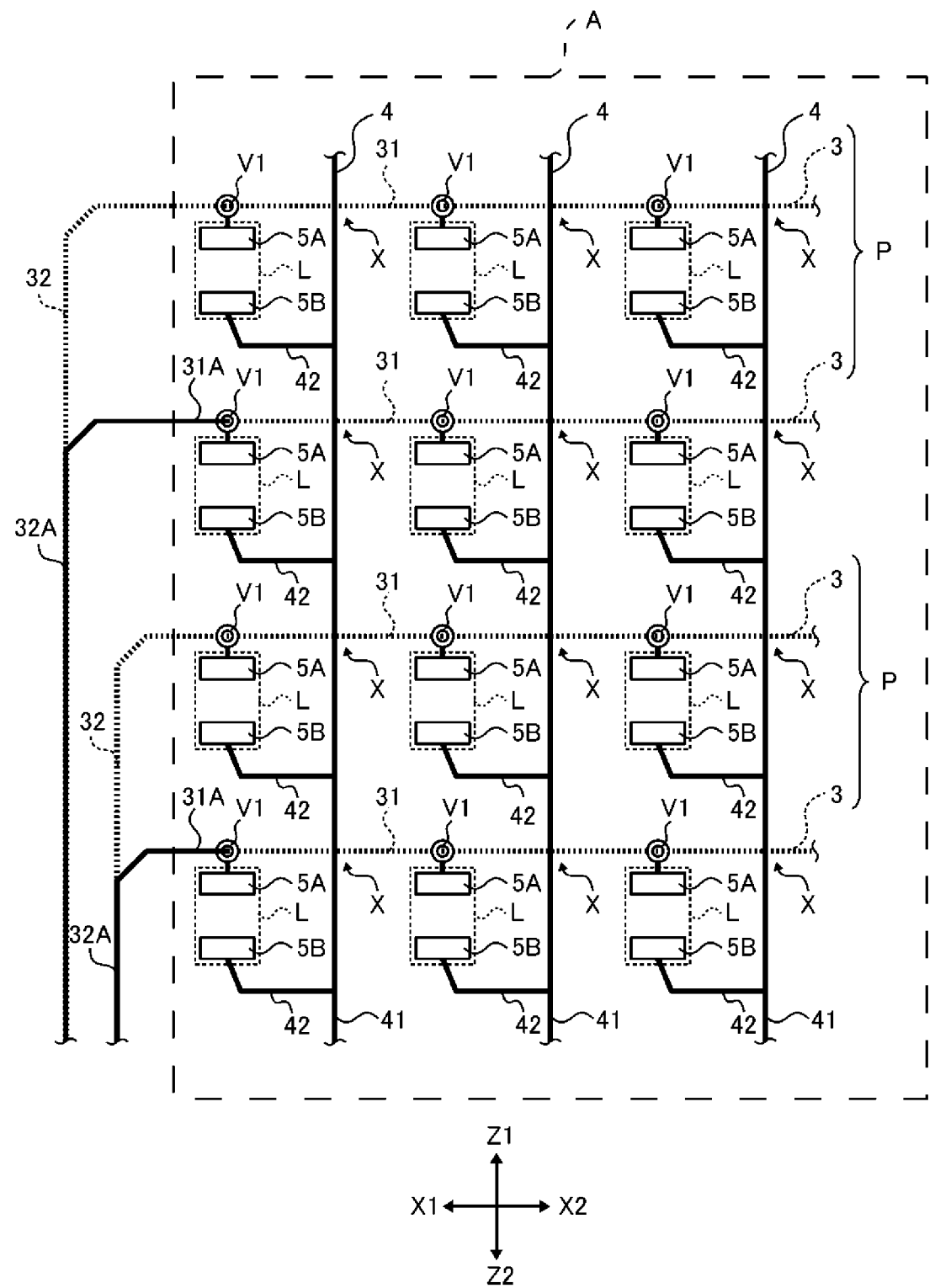
FIG. 4 is a diagram showing an example of wiring patterns formed on both surfaces of a circuit board in the display device according to a first embodiment.
Figure 5:
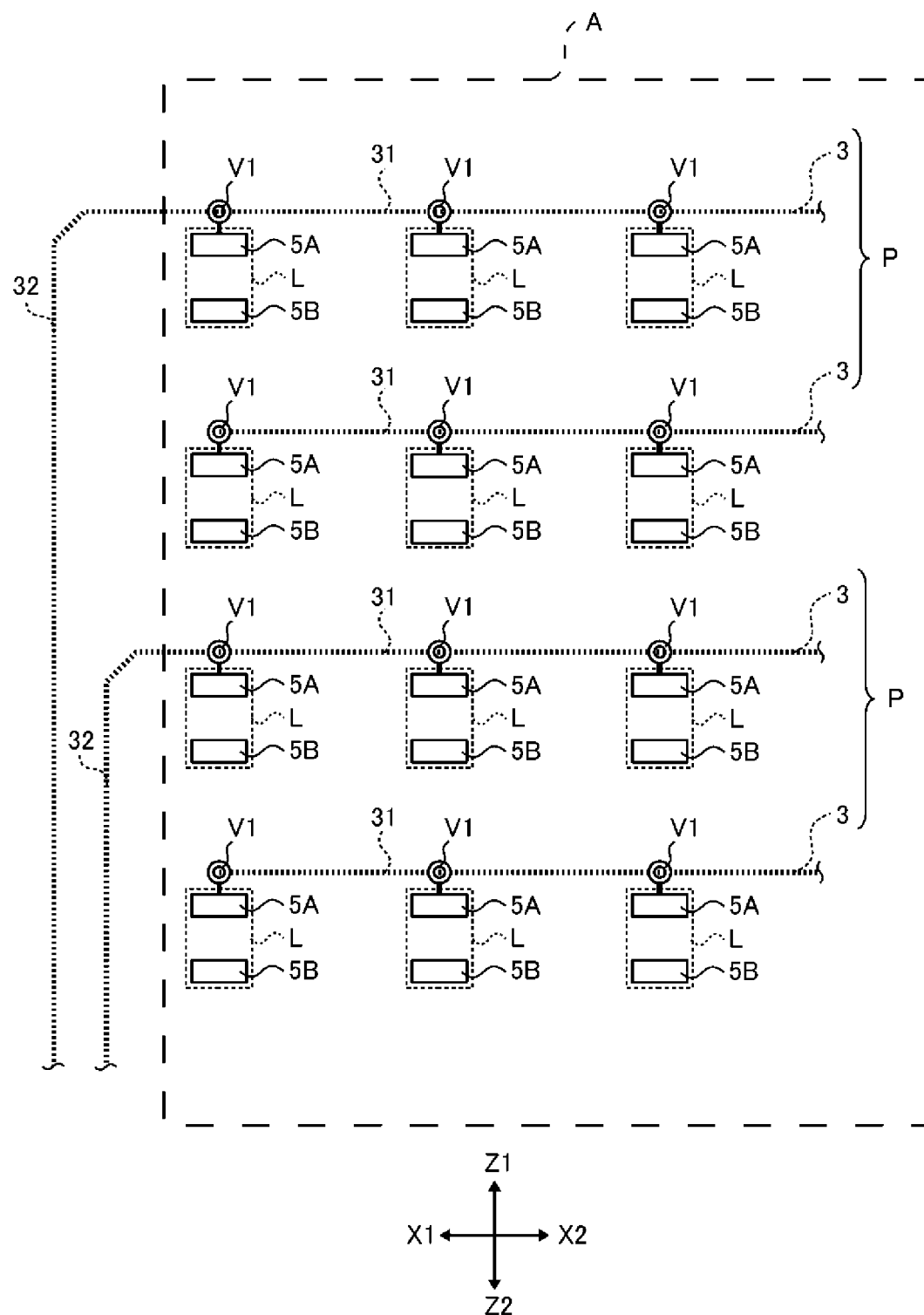
FIG. 5 is a diagram showing an example of one of the wiring patterns, which is formed on a rear surface of the circuit board in the display device according to the first embodiment.
Figure 6:
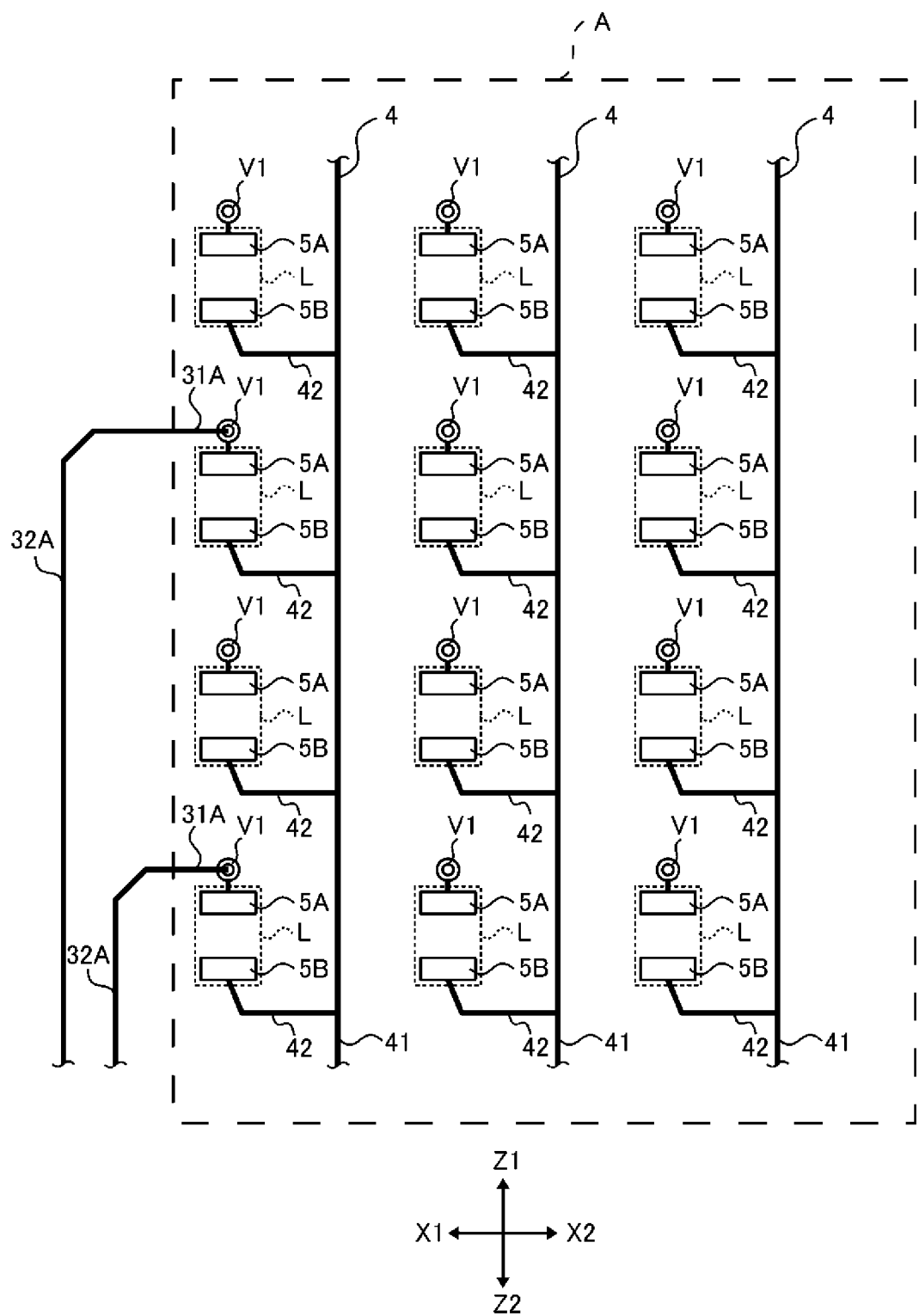
FIG. 6 is a diagram showing an example of another one of the wiring patterns, which is formed on a front surface of the circuit board in the display device according to the first embodiment.

FIG. 4 is a diagram showing an example of wiring patterns formed on both the surfaces (front surface 21 and rear surface 22) of the circuit board 2 in the display device 1 according to the first embodiment. FIG. 5 is a diagram showing an example of one of the wiring patterns shown in FIG. 4, which is formed on the rear surface 22 of the circuit board 2. FIG. 6 is a diagram showing an example of another one of the wiring patterns shown in FIG. 4, which is formed on the front surface 21 of the circuit board 2.

FIG. 4 to FIG. 6 and FIG. 7 to FIG. 13 to be referred to below are each a partial plan view of the circuit board 2 as viewed from the front side (front surface 21 side). In these figures, the wires formed on the front surface 21 are indicated by solid lines, and the wires formed on the rear surface 22 are indicated by dotted lines. Reference symbols "5A" and "5B" in the figures denote conductive pads that are conducted respectively to the terminals TA and TB of each of the light-emitting elements L. A plurality of pairs of conductive pads (5A and 5B) corresponding to the plurality of light-emitting elements L are formed on the front surface 21 of the circuit board 2. The conductive pad 5A is conducted to the terminal TA, and the conductive pad 5B is conducted to the terminal TB.

A region A surrounded by a long-dashed line in FIG. 4 to FIG. 6 is a region where the plurality of light-emitting elements L are arrayed in matrix. Such a region A includes a plurality of regions A provided on the front surface 21 of the circuit board 2.

As shown in FIG. 4 and FIG. 5, the row wires 3 are formed mainly on the rear surface 22 of the circuit board 2, and extend mainly in a row direction (lateral direction). Meanwhile, as shown in FIG. 4 and FIG. 6, the column wires 4 are formed mainly on the front surface 21 of the circuit board 2, and extend mainly in the column direction (vertical direction). At intersection portions X of the plurality of row wires 3 and the plurality of column wires 4, the row wires 3 are formed on the rear surface 22 of the circuit board 2, and the column wires 4 are formed on the front surface 21 of the circuit board 2. With this, chip components and the like for causing the row wires 3 and the column wires 4 to intersect with each other can be omitted.

As shown in FIG. 6, the column wires 4 each include one column-direction extending portion 41 and a plurality of pad connection portions 42. The column-direction extending portion 41 is formed on the front surface 21 of the circuit board 2, and extends in the column direction as a whole. The plurality of pad connection portions 42 are formed on the front surface 21 of the circuit board 2, and each connect a corresponding one of the respective conductive pads 5B of the plurality of light-emitting elements L belonging to the same one of the columns to the column-direction extending portion 41. The pad connection portions 42 are each branched from the column-direction extending portion 41 and connected to the corresponding one of the conductive pads 5B.

A reference symbol "P" in FIG. 4 denotes the row wires 3 in a pair constituted by two of the row wires 3. The pair P of row wires 3 include parts that are located on an outside of the region A, and that are formed on the different surfaces (front surface 21 and rear surface 22) of the circuit board 2 so as to overlap with each other in the plan view of the circuit board 2. The pair of row wires 3 including the overlapping parts in the plan view on the outside of the region A are constituted by the two row wires 3 corresponding to adjacent two of the rows in the matrix array of the light-emitting elements L. In the example shown in FIG. 4, the row wire 3 in a first row and the row wire 3 in a second row constitute one of the pairs P, and the row wire 3 in a third row and the row wire 3 in a fourth row constitute another one of the pairs P.

In each of the pairs P of row wires 3, one of the row wires 3 includes a row-direction extending portion 31 and a column-direction extending portion 32, and another one of the row wires 3 includes the row-direction extending portion 31 and a column-direction extending portion 32A. The row-direction extending portions 31 are formed on the rear surface 22 of the circuit board 2, and each extend in the row direction as a whole in an inside of the region A. The column-direction extending portion 32 is formed on the rear surface 22 of the circuit board 2, and extends in the column direction as a whole on the outside of the region A. The column-direction extending portion 32A is formed on the front surface 21 of the circuit board 2, and extends in the column direction as a whole on the outside of the region A. As shown in FIG. 4, the column-direction extending portion 32 of the one of the pair P of row wires 3, and the column-direction extending portion 32A of the other one of the pair P of row wires 3 partially overlap with each other in the plan view of the circuit board 2.

As shown in FIG. 4 and FIG. 5, the row wires 3 each include a plurality of vias V1 provided on a route that connects the terminals TA of the plurality of light-emitting elements L belonging to the same one of the rows, and the row-direction extending portion 31 formed on the rear surface 22 to each other. The vias V1 are each a conductor formed through the front surface 21 and the rear surface 22 of the circuit board 2. The conductive pad 5A of each of the light-emitting elements L is electrically connected to the row-direction extending portion 31 through a corresponding one of the vias V1.

The other one of the pair P of row wires 3 is traversed from the rear surface 22 to the front surface 21 through one of the vias V1, the one of the vias V1 being connected to the terminal TA of one of the light-emitting elements L, the one of the light-emitting elements L belonging to an outermost one of the columns in the matrix array. Specifically, the second one of the row wires 3 from the top in the region A is traversed from the rear surface 22 to the front surface 21 through one of the vias V1 (via V1 that is second from the top and first from the left), the one of the vias V1 being connected to the conductive pad 5A of one of the light-emitting elements L, the one of the light-emitting elements L belonging to a leftmost one of the columns. In other words, the row-direction extending portion 31 on the rear surface 22 and the column-direction extending portion 32A on the front surface 21 are connected to each other through this via V1. This via V1 has a function to traverse the row wire 3 from the rear surface 22 to the front surface 21, and has a function to electrically connect the row wire 3 (row-direction extending portion 31) on the rear surface 22 and the conductive pad 5A on the front surface 21 to each other.

The display device 1 according to the first embodiment, which is configured as described above, provides the following advantages.

(1-1) At the intersection portions X of the plurality of row wires 3 and the plurality of column wires 4, the row wires 3 and the column wires 4 are formed on the different surfaces (front surface 21 and rear surface 22) of the transparent circuit board 2. Thus, in comparison with a case where the chip components and the like are used for causing the row wires 3 and the column wires 4 to intersect with each other, the number of components to be mounted to the circuit board 2 can be reduced. As a result, the transparency of the display region 10 where the plurality of light-emitting elements L are arrayed is easily increased.

Figure 13:
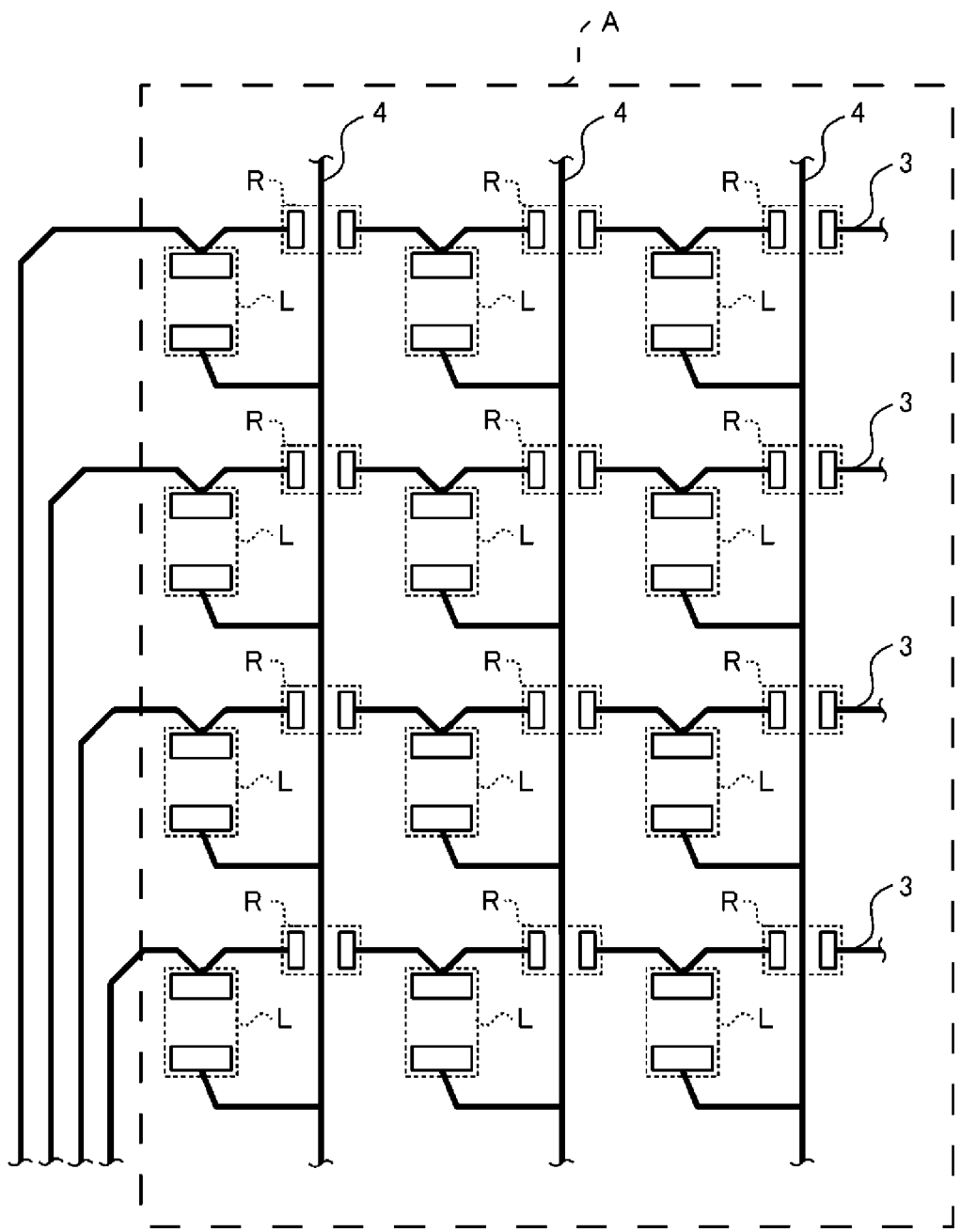
FIG. 13 is a diagram showing a comparative example of the wiring patterns to be formed on the circuit board.

FIG. 13 is a diagram showing a comparative example of the wires to be formed on the circuit board 2. In the comparative example shown in FIG. 13, both the row wires 3 and the column wires 4 are formed on the front surface 21 of the circuit board 2. Thus, chip components R as jumpers are implemented at the intersection portions of the row wires 3 and the column wires 4. As understood from the comparison between FIG. 13 and FIG. 4, the number of non-transparent components on the circuit board 2 is small in the display device 1 according to this embodiment. Thus, the transparency of the display region 10 increases.

(1-2) At the intersection portions X of the plurality of row wires 3 and the plurality of column wires 4, the front surface 21 of the circuit board 2 is unified as a surface on which the column wires 4 are formed, and the rear surface 22 of the circuit board 2 is unified as a surface on which the row wires 3 are formed. With this, the column wires 4 are formed mainly on the front surface 21, and the row wires 3 are formed mainly on the rear surface 22. Thus, these wires can be formed even without use of wiring routes (vias) formed through the front surface 21 and the rear surface 22 of the circuit board 2. As a result, the number of the vias is easily reduced. When the number of the vias is reduced, the transparency of the display region 10 is easily increased.

(1-3) The one or more pairs P of row wires 3 include the parts that are located on the outside of the region A where the plurality of light-emitting elements L are arrayed, and that are formed on the different surfaces (front surface 21 and rear surface 22) of the circuit board 2 such that at least the parts overlap with each other in the plan view of the circuit board 2. When at least the parts of the pair P of two row wires 3 overlap with each other in the plan view of the circuit board 2, an area of a non-transparent part of the display region 10 decreases. In this way, in comparison with a case where there are no such overlapping parts (refer to the comparative example shown in FIG. 13), the transparency of the display region 10 is easily increased.

(1-4) The one pair P of two row wires 3 correspond to adjacent two of the rows, and are located at positions close to each other. Thus, lengths of these row wires 3 are easily reduced, and at the same time, these row wires 3 are easily formed at positions overlapping with each other in the plan view of the circuit board 2. When the lengths of the row wires 3 are reduced, the area of the non-transparent part of the display region 10 decreases. In this way, the transparency of the display region 10 is easily increased.

(1-5) A certain one of the plurality of vias V1 provided on the route connecting the terminals TA of the plurality of light-emitting elements L provided on the front surface 21, and the row wires 3 formed on the rear surface 22 to each other, the certain one being connected to the terminal TA of the one of the light-emitting elements L, the one of the light-emitting elements L belonging to the outermost one of the columns in the matrix array, is used also for traversing one of the pair P of row wires 3 from the rear surface 22 to the front surface 21. In other words, the certain via V1 is used for implementing both a function to connect the row wire 3 on the rear surface 22 and the terminal TA on the front surface 21 to each other, and a function to traverse the row wire 3 from the rear surface 22 to the front surface 21. Thus, in comparison with a case where the via V1 is not used for both the purposes in such a way, the number of vias to be used can be reduced.

Second Embodiment

Next, the display device 1 according to a second embodiment is described. Configuration features of the display device 1 according to the second embodiment are substantially the same as those of the above-described display device 1 according to the first embodiment except that the wiring patterns on the circuit board 2 in the display device 1 according to the first embodiment (specifically, pattern of the row wires 3) are changed. Below, differences from the display device 1 according to the first embodiment are mainly described.

Figure 7:
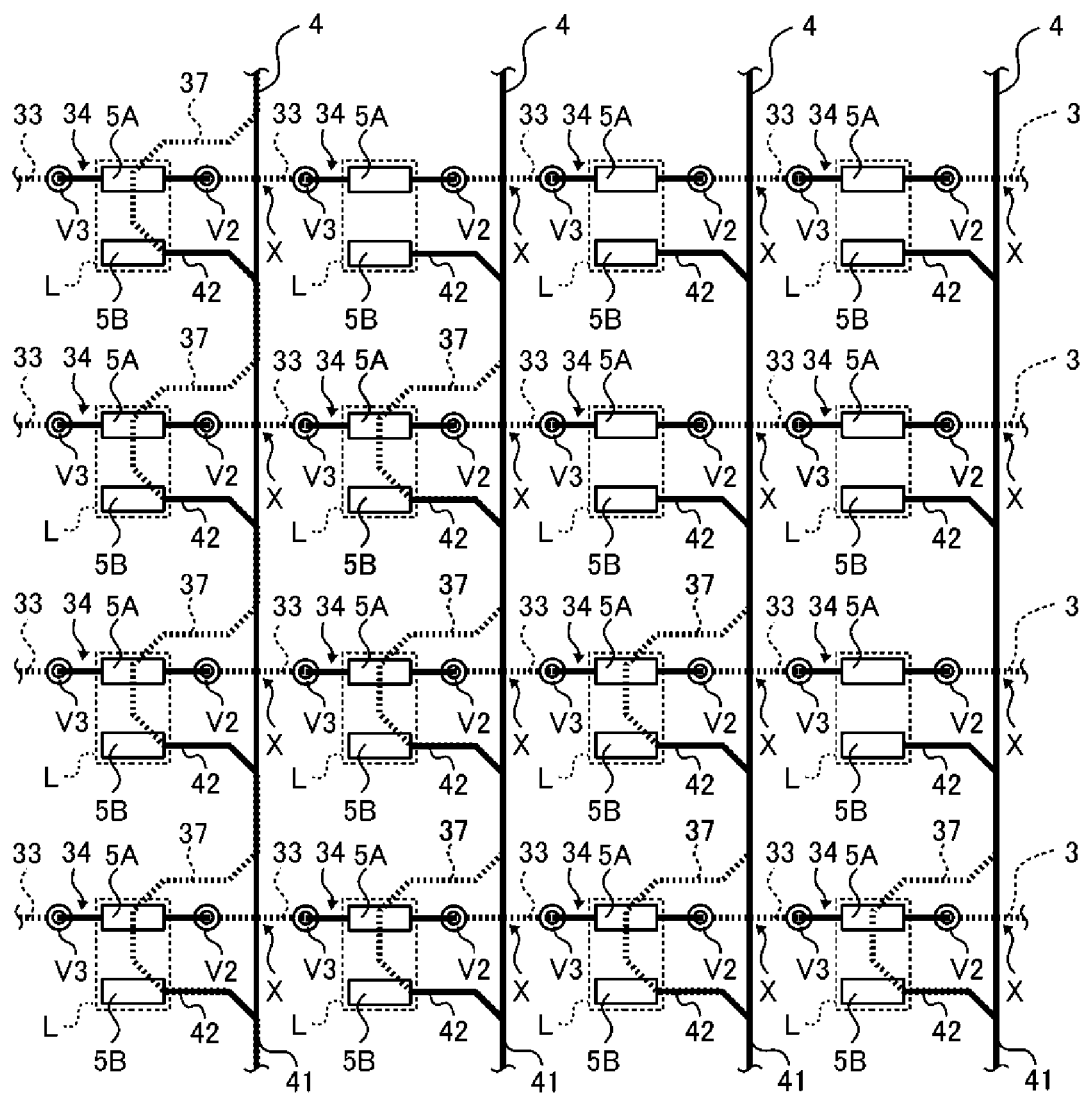
FIG. 7 is a diagram showing an example of wiring patterns formed on both the surfaces of the circuit board in the display device according to a second embodiment.
Figure 8:
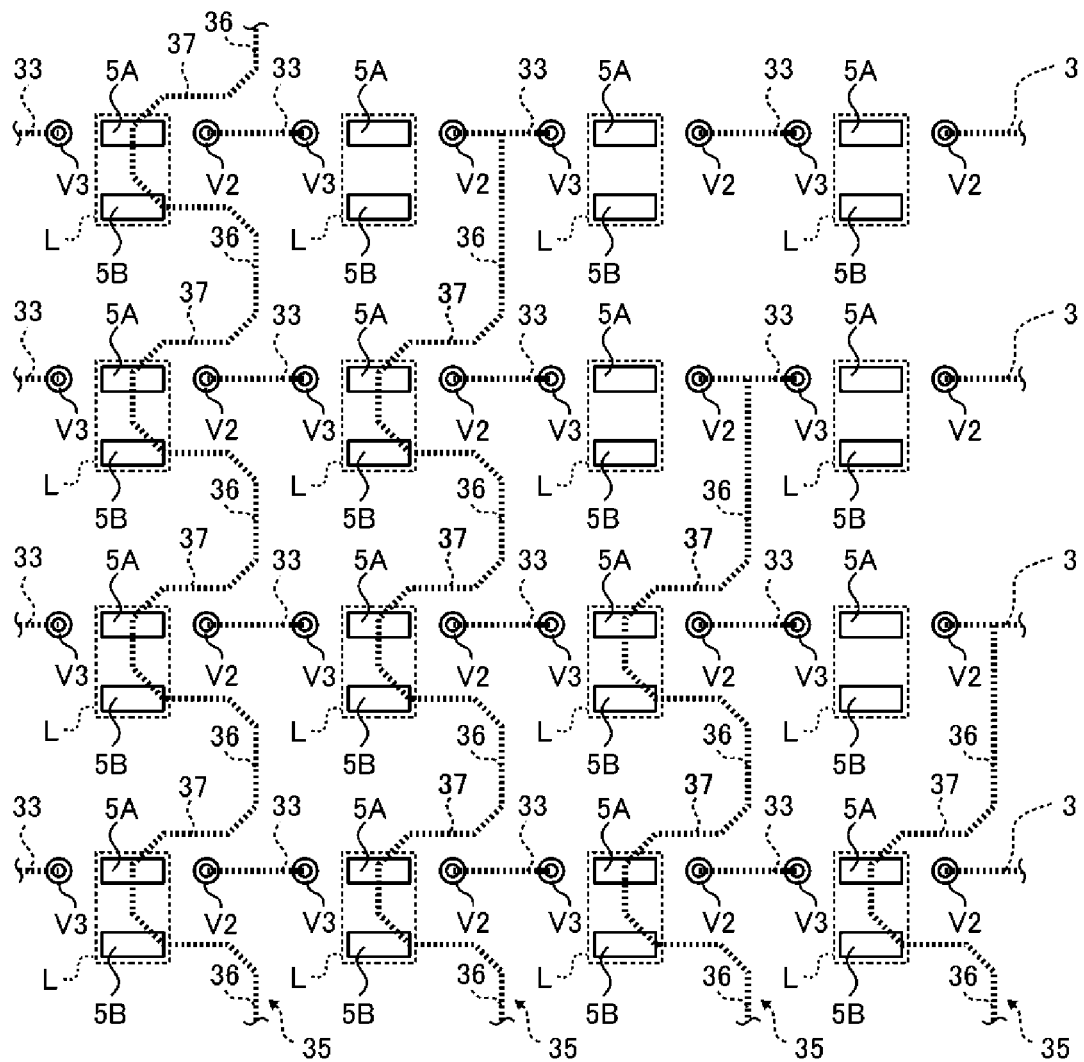
FIG. 8 is a diagram showing an example of one of the wiring patterns, which is formed on the rear surface of the circuit board in the display device according to the second embodiment.
Figure 9:
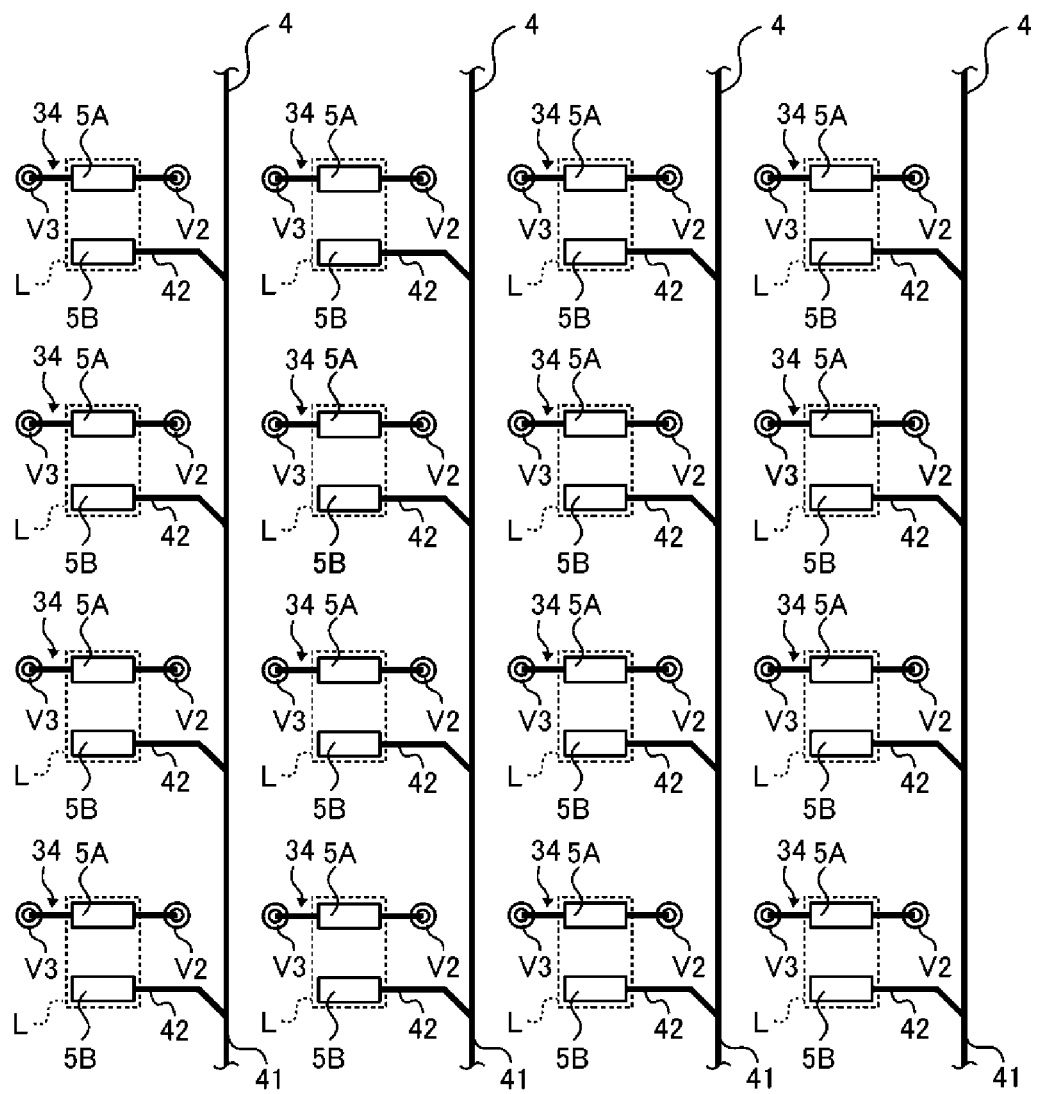
FIG. 9 is a diagram showing an example of another one of the wiring patterns, which is formed on the front surface of the circuit board in the display device according to the second embodiment.

FIG. 7 is a diagram showing an example of wiring patterns formed on both the surfaces (front surface 21 and rear surface 22) of the circuit board 2 in the display device 1 according to the second embodiment. FIG. 8 is a diagram showing an example of one of the wiring patterns shown in FIG. 7, which is formed on the rear surface 22 of the circuit board 2. FIG. 9 is a diagram showing an example of another one of the wiring patterns shown in FIG. 7, which is formed on the front surface 21 of the circuit board 2.

As shown in FIG. 7 and FIG. 9, the column wires 4 in the display device 1 according to this embodiment are substantially the same as the column wires 4 shown in FIG. 4 and FIG. 6.

Meanwhile, as shown in FIG. 7 and FIG. 8, the row wires 3 in the display device 1 according to this embodiment each include a branch wire 35 extending along the columns in the matrix array of the light-emitting elements L, which is different from the above-described row wires 3 (FIG. 4 and FIG. 5).

Specifically, the row wires 3 shown in FIG. 4 and FIG. 5 include the wires (32 and 32A) extending in the column direction on the outside of the region where the light-emitting elements L are arrayed (region A). These wires (32 and 32A) are connected to the drive circuit 201 arranged below (on the Z2-side of) the circuit board 2 without intersecting with the column wires 4. Meanwhile, the row wires 3 shown in FIG. 7 and FIG. 8 are connected to the drive circuit 201 arranged below the circuit board 2 via the branch wires 35 branched in the column direction in the inside of the region where the light-emitting elements L are arrayed.

As shown in FIG. 8, these branch wires 35 each include one or more column-direction extending portions 36 and one or more rear-side bypassing portions 37.

The column-direction extending portions 36 are wires that are formed on the rear surface 22 of the circuit board 2, and that extend such that at least ones of the column-direction extending portions 36 overlap with a corresponding one of the column wires 4 in the plan view of the circuit board 2. Specifically, in FIG. 8, the column-direction extending portions 36 of the branch wire 35 of a first one of the row wires 3 from the top overlap with a second one of the column wires 4 from the left (column-direction extending portion 41) in the plan view. The column-direction extending portions 36 of the branch wire 35 of a second one of the row wires 3 from the top overlap with a third one of the column wires 4 from the left (column-direction extending portion 41) in the plan view. The column-direction extending portions 36 of the branch wire 35 of a third one of the row wires 3 from the top overlap with a fourth one of the column wires 4 from the left (column-direction extending portion 41) in the plan view.

The rear-side bypassing portions 37 are wires that are formed on the rear surface 22 of the circuit board 2, and that bypass the intersection portions X of the row wires 3 and the column wires 4. Specifically, with regard to the branch wire 35 of one of the row wires 3, which partially overlaps with a corresponding one of the column wires 4 in the plan view, the rear-side bypassing portions 37 of this branch wire 35 are formed to bypass ones of the intersection portions X of other ones of the row wires 3 than the corresponding one of the row wires 3 and the one of the column wires. More specifically, in FIG. 8, the branch wire 35 of the first one of the row wires 3 from the top includes three rear-side bypassing portions 37. These three rear-side bypassing portions 37 bypass three of the intersection portions X of the second one of the column wires 4 from the left (column-direction extending portion 41) and second to fourth ones of the row wires 3 from the top.

In addition, as shown in FIG. 7 to FIG. 9, the row wires 3 each include one or more row-direction extending portions 33 and one or more front-side bypassing portions 34.

The row-direction extending portions 33 are wires that are formed on the rear surface 22 of the circuit board 2, and that extend along the rows in the matrix array of the light-emitting elements L.

The front-side bypassing portions 34 are wires that are formed on the front surface 21 of the circuit board 2, and that intersect with the rear-side bypassing portions 37. As shown in FIG. 7 to FIG. 9, a left-hand one end of each one of the front-side bypassing portions 34 is connected to a corresponding one of the row-direction extending portions 33 through a via V3, which extends further to the left from the one of the front-side bypassing portions 34. A right-hand one end of each one of the front-side bypassing portions 34 is connected to another corresponding one of the row-direction extending portions 33 through a via V2, which extends further to the right from the one of the front-side bypassing portions 34.

As shown in FIG. 7 to FIG. 9, the conductive pads 5A each conducted to a corresponding one of the respective terminals TA of the light-emitting elements L are used also as the front-side bypassing portions 34. In other words, the conductive pads 5A each constitutes a part of the front-side bypassing portion 34 bridged between the via V2 and the via V3.

As shown in FIG. 7 and FIG. 8, in the plan view of the circuit board 2, the rear-side bypassing portions 37 each include a part that is formed at a position overlapping with a region where a corresponding one of the light-emitting elements L each including the pair of conductive pads (5A and 5B) (region surrounded by a thin dotted line)) is attached. In addition, in the plan view of the circuit board 2, the rear-side bypassing portions 37 each include another part that is formed at a position overlapping with the pad connection portion 42 of the column wire 4.

The display device 1 according to the second embodiment, which is configured similar to the display device 1 according to the first embodiment as described above, provides advantages similar to those to be provided by the similar configuration of the display device 1 according to the first embodiment, and in addition, provides the following advantages.

(2-1) A circuit to be connected to the branch wires 35 extending along the columns (such as the drive circuit 201), and a circuit to be connected to the column wires 4 extending along the columns (such as the drive circuit 202) are easily arranged close to each other (for example, below the circuit board 2). With this, a region on the circuit board 2, where the circuits are arranged, can be made compact. In addition, in the plan view of the circuit board 2, at least one of the column-direction extending portions 36 of the branch wires 35 extends to overlap with a corresponding one of the column wires 4 (column-direction extending portions 41). Thus, the area of the non-transparent part of the display region 10 can be reduced. As a result, the transparency of the display region 10 can be increased.

(2-2) The plurality of pairs of conductive pads (5A and 5B) each include the at least one conductive pad 5A that is used also as the front-side bypassing portions 34. Thus, in comparison with a case where the front-side bypassing portions 34 and the conductive pads 5A are used independently of each other, the area of the non-transparent part of the display region 10 can be reduced. In addition, in the plan view of the circuit board 2, the part of each of the rear-side bypassing portions 37 is formed at the position overlapping with the region where a corresponding one of the light-emitting elements L is attached. Thus, in comparison with a case where the rear-side bypassing portions 37 are each arranged at a position out of the region where the corresponding one of the light-emitting elements L is attached, the area of the non-transparent part of the display region 10 can be reduced.

(2-3) In the plan view of the circuit board 2, the other part of each of the rear-side bypassing portions 37 of the branch wires 35 is formed at the position overlapping with the pad connection portion 42 of the column wire 4. Thus, in comparison with a case where the rear-side bypassing portions 37 are each formed at a position not overlapping with the pad connection portion 42, the area of the non-transparent part of the display region can be reduced.

The present invention is not limited to the above-described embodiments. Specifically, those skilled in the art may make various modifications, combinations, sub-combinations, and alterations of the components of the above-described embodiments within the technical scope of the present invention or the equivalents thereof.

For example, in the display device according to another embodiment of the present invention, wiring patterns combining a part of the wiring patterns in the display device according to the first embodiment (refer, for example to FIG. 4 to FIG. 6), and a part of the wiring patterns in the display device according to the second embodiment (refer, for example to FIG. 7 to FIG. 9) with each other may be formed on the circuit board.

Figure 10:
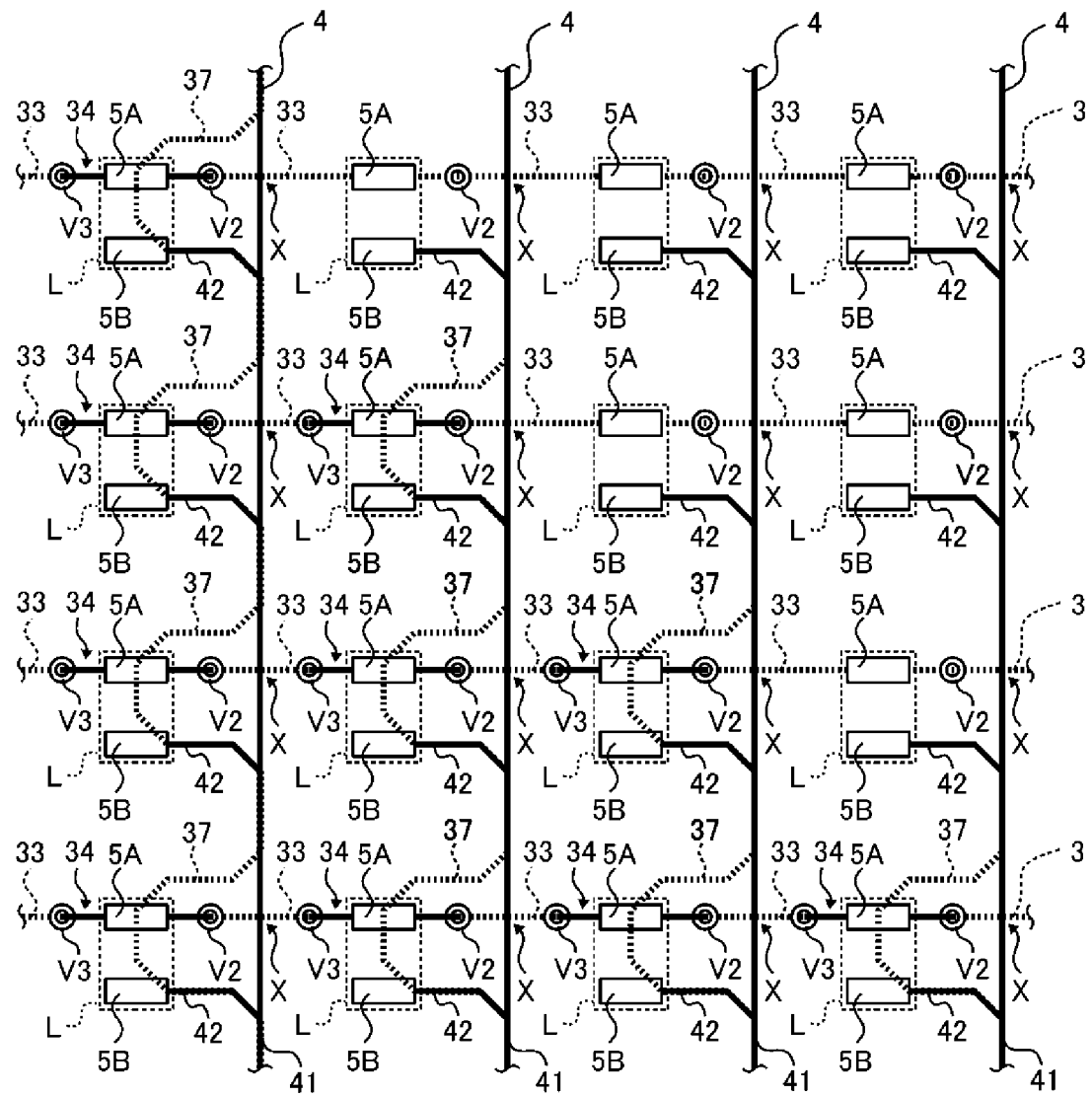
FIG. 10 is a diagram showing an example of wiring patterns formed on both the surfaces of the circuit board in a modification of the display device according to the second embodiment.
Figure 10:
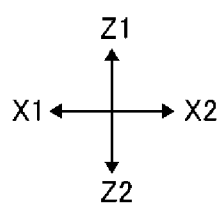
Figure 11:
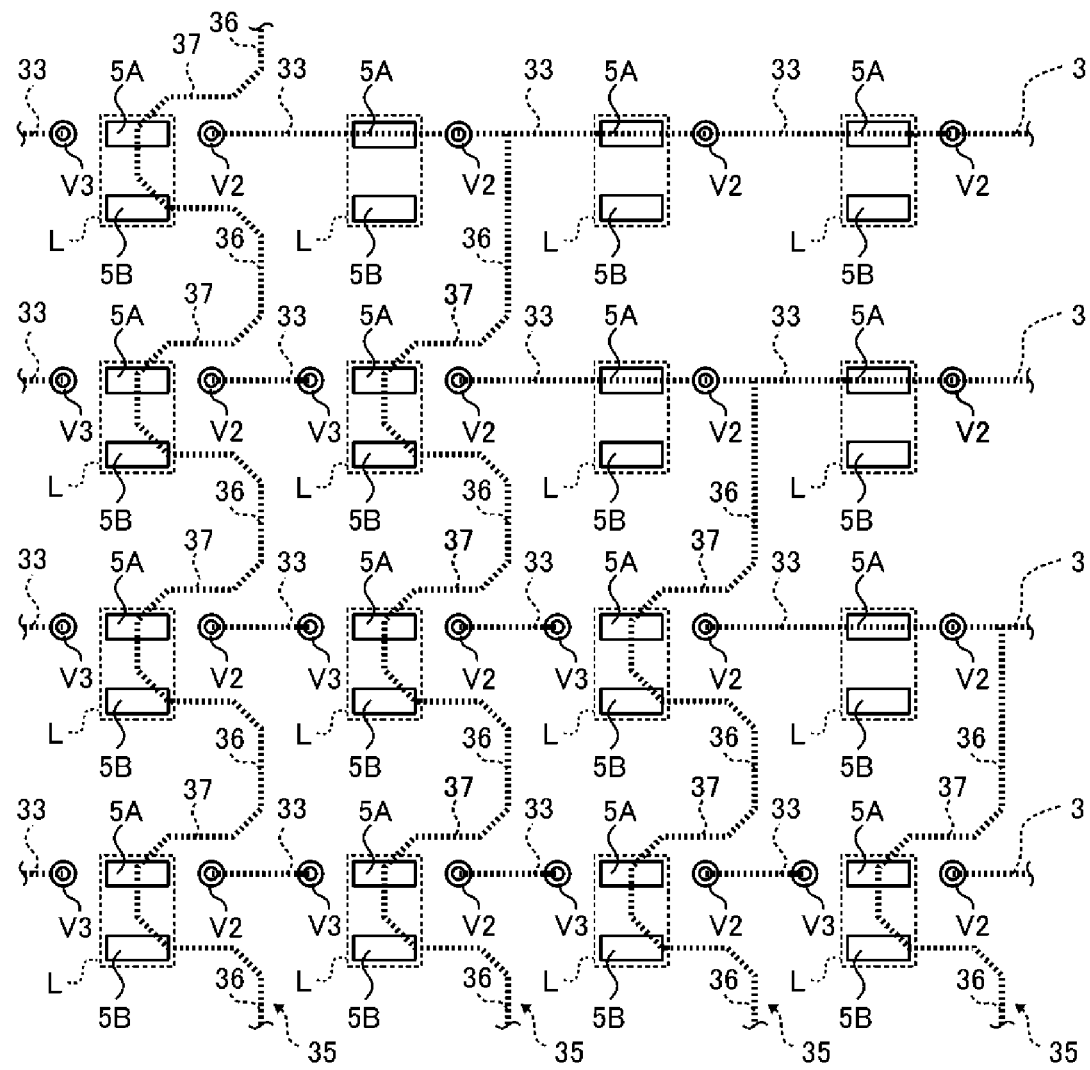
FIG. 11 is a diagram showing an example of one of the wiring patterns, which is formed on the rear surface of the circuit board in the modification of the display device according to the second embodiment.
Figure 12:
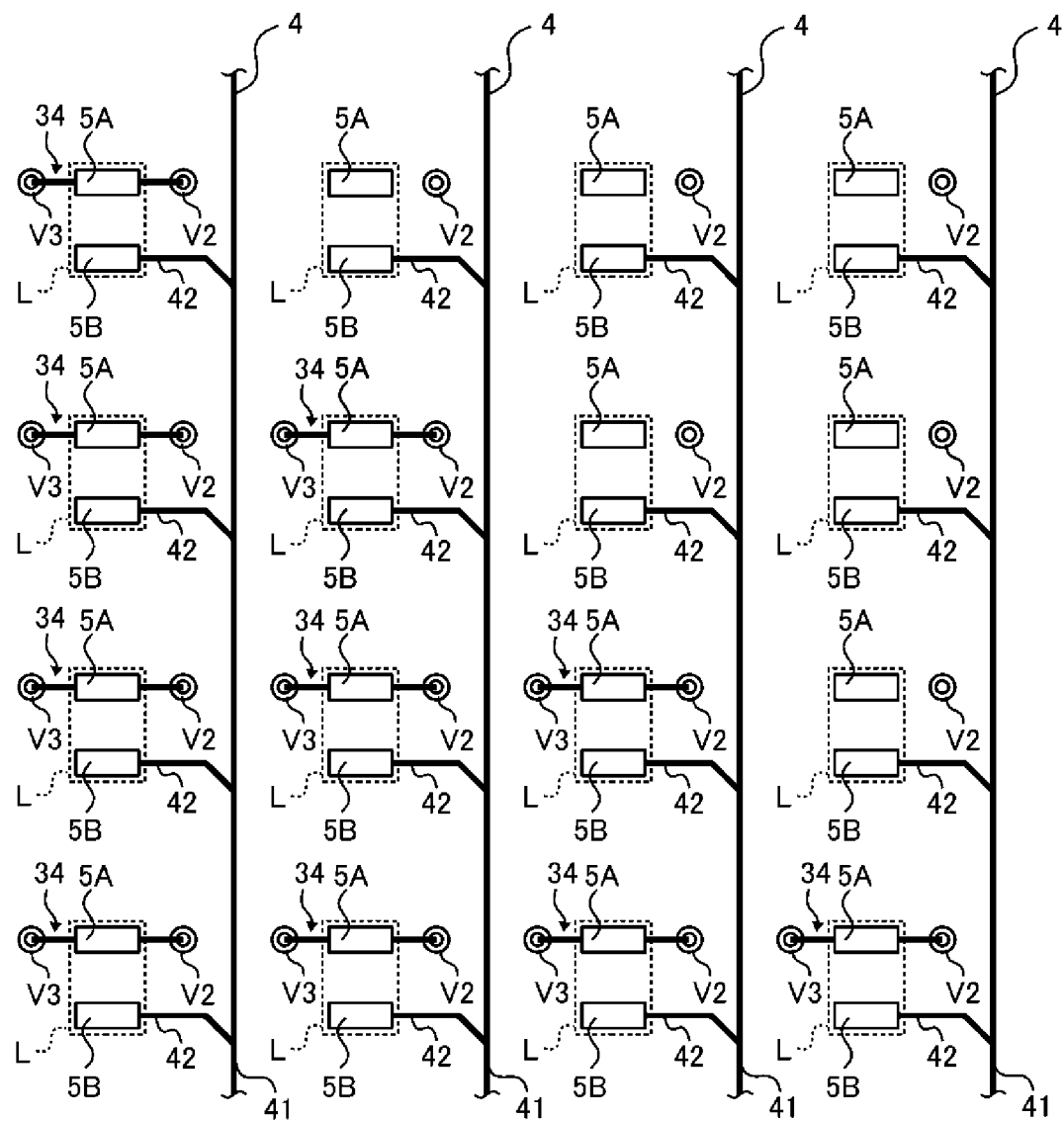
FIG. 12 is a diagram showing an example of another one of the wiring patterns, which is formed on the front surface of the circuit board in the modification of the display device according to the second embodiment.

In addition, although the front-side bypassing portion 34 is provided at each of the intersection portions X in the display device 1 according to the second embodiment, as shown, for example, in FIG. 10 to FIG. 13, the front-side bypassing portions 34 need not necessarily be provided at ones of the intersection portions X, which the rear-side bypassing portions 37 of the branch wires 35 do not bypass. FIG. 10 is a diagram showing an example of wiring patterns formed on both the surfaces (front surface 21 and rear surface 22) of the circuit board 2 in a modification of the display device 1 according to the second embodiment. FIG. 11 is a diagram showing an example of one of the wiring patterns shown in FIG. 10, which is formed on the rear surface 22 of the circuit board 2. FIG. 12 is a diagram showing an example of another one of the wiring patterns shown in FIG. 10, which is formed on the front surface 21 of the circuit board 2. In the modification shown in FIG. 10 to FIG. 13, among the front-side bypassing portions 34, ones corresponding to the ones of the intersection portions X, which the rear-side bypassing portions 37 do not bypass, are omitted. Thus, one of the two vias to be connected to both the ends of each of the ones of the front-side bypassing portions 34 (via V3) is omitted.

The invention claimed is:

1. A display device, comprising:
  a transparent circuit board; and
  a plurality of light-emitting elements arrayed in a matrix on the transparent circuit board,
  the plurality of light-emitting elements each including a pair of terminals to which drive voltage for light emission is applied,
  the transparent circuit board including
    a plurality of row wires each connecting ones of the pairs of terminals of ones of the plurality of light-emitting elements to each other, the ones of the plurality of light-emitting elements belonging to a same one of rows in the matrix array, and
    a plurality of column wires each connecting other ones of the pairs of terminals of ones of the plurality of light-emitting elements to each other, the ones of the plurality of light-emitting elements belonging to a same one of columns in the matrix array,
  the plurality of row wires and the plurality of column wires being formed on different surfaces of the transparent circuit board at intersection portions of the plurality of row wires and the plurality of column wires,
  the plurality of column wires being formed on a front surface of the transparent circuit board at the intersection portions of the plurality of row wires and the plurality of column wires,
  the plurality of row wires being formed on a rear surface of the transparent circuit board at the intersection portions of the plurality of row wires and the plurality of column wires,
  the plurality of row wires including one or more pairs of row wires, the one or more pairs of row wires including parts
    that are located on an outside of a region where the plurality of light-emitting elements are arrayed in a plan view of the transparent circuit board, and
    that are formed on the different surfaces of the transparent circuit board such that at least the parts overlap with each other in the plan view of the transparent circuit board,
  the one or more pairs of row wires including one row wire that is traversed from the rear surface to the front surface through one of the vias, the one of the vias being connected to one of the pair of terminals of one of the plurality of light-emitting elements, the one of the plurality of light-emitting elements belonging to an outermost one of the columns in the matrix array.

2. The display device according to claim 1, wherein the one or more pairs of row wires include two of the plurality of row wires, the two of the plurality of row wires corresponding to adjacent two of the rows in the matrix array.

3. The display device according to claim 2, wherein the plurality of light-emitting elements are arrayed on the front surface of the transparent circuit board, and the plurality of row wires each include the plurality of vias provided on a route that connects the ones of the pairs of terminals of the ones of the plurality of light-emitting elements and a corresponding one of the plurality of row wires formed on the rear surface to each other, the ones of the plurality of light-emitting elements belonging to the same one of the rows in the matrix array.

4. A display device, comprising:

a transparent circuit board; and a plurality of light-emitting elements arrayed in a matrix on the transparent circuit board, the plurality of light-emitting elements each including a pair of terminals to which drive voltage for light emission is applied, the transparent circuit board including a plurality of row wires each connecting ones of the pairs of terminals of ones of the plurality of light-emitting elements to each other, the ones of the plurality of light-emitting elements belonging to a same one of rows in the matrix array, and a plurality of column wires each connecting other ones of the pairs of terminals of ones of the plurality of light-emitting elements to each other, the ones of the plurality of light-emitting elements belonging to a same one of columns in the matrix array, the plurality of row wires and the plurality of column wires being formed on different surfaces of the transparent circuit board at intersection portions of the plurality of row wires and the plurality of column wires, the plurality of column wires being formed on a front surface of the transparent circuit board at the intersection portions of the plurality of row wires and the plurality of column wires, the plurality of row wires being formed on a rear surface of the transparent circuit board at the intersection portions of the plurality of row wires and the plurality of column wires, the plurality of row wires including at least one row wire including a branch wire extending along the columns in the matrix array, the branch wire of the at least one row wire including one or more column-direction extending portions that are formed on the rear surface, and that extend such that at least one of the one or more column-direction extending portions overlaps with a corresponding one of the plurality of column wires in a plan view of the transparent circuit board, and one or more rear-side bypassing portions that are formed on the rear surface, and that bypass ones of the intersection portions of the corresponding one of the plurality of column wires and other ones of the plurality of row wires, the at least one column wire including one or more front-side bypassing portions that are formed on the front surface, and that intersect with the one or more rear-side bypassing portions.

5. The display device according to claim 4, wherein the transparent circuit board includes a plurality of pairs of conductive pads corresponding to the plurality of light-emitting elements, the plurality of pairs of conductive pads are each conducted to a corresponding one of the pairs of terminals of corresponding ones of the plurality of light-emitting elements, the plurality of pairs of conductive pads include at least one conductive pad that is used also as the one or more front-side bypassing portions, and the one or more rear-side bypassing portions each include a part that is formed at a position overlapping with a region where a corresponding one of the plurality of light-emitting elements is attached in the plan view of the transparent circuit board, the corresponding one of the plurality of light-emitting elements including corresponding ones of the plurality of pairs of conductive pads.

6. The display device according to claim 5, wherein the plurality of column wires each include a plurality of pad connection portions that are formed on the front surface, and that are connected to a plurality of corresponding ones of the plurality of pairs of conductive pads, and the one or more rear-side bypassing portions each include another part that is formed at a position overlapping with a corresponding one of the plurality of pad connection portions in the plan view of the transparent circuit board.

\* \* \* \* \*